US006537872B1

United States Patent
Tsao et al.

(10) Patent No.: US 6,537,872 B1
(45) Date of Patent: Mar. 25, 2003

(54) METHOD OF FABRICATING A DRAM CELL CAPACITOR

(75) Inventors: Li-Wu Tsao, Keelung (TW); Chih-Han Chang, Taipei Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/126,094

(22) Filed: Apr. 19, 2002

(51) Int. Cl.$^7$ .......................................... H01L 21/8242
(52) U.S. Cl. ...................... 438/244; 438/249; 438/387; 438/665
(58) Field of Search ................... 438/244, 246, 438/249, 387, 255, 398, 665, 964, FOR 189, FOR 212, FOR 488; 148/DIG. 138

(56) References Cited

U.S. PATENT DOCUMENTS

| | | | | |
|---|---|---|---|---|
| 6,159,874 A | * | 12/2000 | Tews et al. | |
| 6,340,613 B1 | * | 1/2002 | DeBoer | |
| 6,358,793 B1 | * | 3/2002 | Yates et al. | |
| 6,455,369 B1 | * | 9/2002 | Förster et al. | |
| 6,465,301 B1 | * | 10/2002 | Cheong | |
| 6,472,266 B1 | * | 10/2002 | Yu et al. | |
| 6,483,194 B2 | * | 11/2002 | Sakao | |
| 6,492,245 B1 | * | 12/2002 | Liu et al. | |

* cited by examiner

Primary Examiner—Olik Chaudhuri
Assistant Examiner—Joannie Adelle Garcia
(74) Attorney, Agent, or Firm—Merchant & Gould, P.C.

(57) ABSTRACT

A method of fabricating a capacitor of a DRAM cell. First, an insulating layer is formed on the semiconductor substrate at the top portion of the trench. Afterward, a seed layer on the ringed insulating layer and the semiconductor substrate at the bottom portion of the trench. A photoresist is coated in the trench at the bottom portion. Next, the seed layer is partially removed to expose the ringed insulating layer while the photoresist is used as the shield. The photoresist is then removed to expose the remaining seed layer at the bottom portion. A hemispherical silicon grain layer is deposited from the remaining seed layer on the semiconductor substrate. Ions are doped the hemispherical silicon grain layer and the semiconductor substrate so as to create a doped area to serve as the lower electrode of the capacitor.

12 Claims, 8 Drawing Sheets

METHOD OF FABRICATING A DRAM CELL CAPACITOR

BACKGROUND OF THE INVENTION

1. Field of the Invention

The present invention relates to the manufacture of semiconductor memory cells, more particularly, to a method of forming a trenched capacitor for a dynamic random access memory (DRAM) cell.

2. Description of the Related Art

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determine the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to either transfer charge to or from the charge storage capacitor. The selective coupling of the charge storage capacitor to the bit line is typically accomplished using a transfer field effect transistor (FET). The bit line contact is typically made to one of the source/drain electrodes of the transfer FET and the charge storage capacitor is typically formed in contact with the other of the source/drain electrodes of the transfer FET. Word line signals are supplied to the gate of the FET to connect one electrode of the charge storage capacitor through the transfer FET to the bit line contact facilitating the transfer of charge between the charge storage capacitor and the bit line.

There is a continuing trend toward increasing the storage density of integrated circuit memories to provide increased quantities of data storage on a single chip. To address the challenges of reduced structure sizes, DRAM designs have been proposed which incorporate capacitors having vertical extensions above the surface of the substrate ("stacked" capacitors) or below the surface of the substrate ("trenched" capacitors). By adopting a more three-dimensional structure, such DRAM designs provide memory capacitors having larger capacitance but which consume less of the substrate surface area.

FIGS. 1A to 1H, are cross-sections showing the manufacturing steps of fabricating a capacitor of a DRAM cell in accordance with the prior art.

Referring now to FIG. 1A, a semiconductor substrate 100, for example a p-type silicon substrate, is provided. A pad oxide 102, having a thickness of 400 angstroms, is grown on the upper surface of the semiconductor substrate 100 by thermal oxidation. A pad nitride 104, having a thickness of 1600 angstroms, is deposited on the pad oxide 102. Next, a silicon glass 108 such as boro-silicate glass (BSG), having a thickness of 5000 angstroms, is deposited by an in-situ doped chemical vapor deposition system. The silicon glass 108, pad nitride 104, and pad oxide 102 are defined by conventional photolithography so that an etching mask EM having an opening for deep trench is formed on the semiconductor substrate 100. Symbol 107 indicates a hard mask consisting of the pad nitride 104 and the pad oxide 102.

Referring now to FIG. 1B, the semiconductor substrate 100 is anisotropically etched through the opening of the etching mask EM to form a deep trench 112. Then, the silicon glass 108 is removed to expose the pad nitride 104 by an isotropic etching step. The deep trench 112 has a top portion TP, and a bottom portion BP.

As shown in FIG. 1C, a conductive layer 114, having a thickness of 50 to 400 angstroms, is deposited on the hard mask 107 and extended on the deep trench 112 by in-situ doped chemical vapor deposition. The conductive layer 114 can be a semiconductor material doped with arsenic ions.

Referring now to FIG. 1D, a photoresist 122 is formed in the bottom portion BP of the deep trench 112 to expose the conductive layer 114 at the top portion TP of the deep trench 112. Next, the exposed conductive layer 114 is removed followed by stripping the photoresist 122 as shown in FIG. 1E. An insulating layer 126 is formed on the pad nitride 104 and the deep trench 112 to cover the conductive layer 114. The arsenic ions formed in the conductive layer 114 are diffused and driven in the semiconductor substrate 100 so as to form a doped area having a depth of about 800 angstroms to serve as the lower electrode 130 of the capacitor. The insulating layer 126 is then removed.

As shown in FIG. 1F, a dielectric layer 132, for example silicon oxide/silicon nitride/silicon oxide (ONO), is formed on the conductive layer 114. Next, a doped polysilicon, to serve as the upper electrode 142 of the capacitor, is deposited on the dielectric layer 132 by low pressure chemical vapor deposition (LPCVD) followed by etching back. The dielectric layer 132 and the upper electrode 142 are also formed at the bottom portion BP of the deep trench 112.

Referring to FIG. 1G, a ringed insulating layer 160 is formed adjacent to the conductive layer 114 at a part of the top portion TP. Then, a conductive structure 164 whose upper surface is higher than that of the ringed insulating layer 160 is formed on the upper electrode 142 and the dielectric layer 132.

Next, a doped polysilicon film 166, having a thickness of about 600 angstroms, is deposited on the conductive structure 164 and the ringed insulating layer 160. The doped polysilicon film 166 has dopants such as phosphorus ions or arsenic ions therein. Next, an insulating layer 170, having a thickness of about 500 angstroms, is formed on the doped polysilicon film 166. The dopants of the doped polysilicon film 166 are then diffused and driven in the semiconductor substrate 100 at the top portion TP so as to form a doped region 172 to serve as the source region.

As shown in FIG. 1H, the hard mask 107 is removed. Shallow trench isolation 180 for defining an active region 186, gate oxides 184, and word lines 188 are then formed by conventional skills.

A higher level of integration, however, requires a proportional reduction in the area of the conducting elements of the capacitor in the DRAM cell, thus resulting in lower capacitance. The reliability of the data stored on the capacitor in the DRAM cell is therefore reduced. There is a need for providing a method of fabricating a capacitor, which has high capacitance.

SUMMARY OF THE INVENTION

In view of the above disadvantages, an object of the invention is to provide a method of fabricating a capacitor of a DRAM cell. According to the method, the lower electrode of the capacitor has rugged surface thus increasing the capacitance.

In accordance with an aspect of the invention, there is provided a method of fabricating a capacitor of a DRAM cell. First, a semiconductor substrate is provided. Then, an etching mask with an opening is formed on the semiconductor substrate. The semiconductor substrate is then etched through the opening of the etching mask to form a trench having a top portion and a bottom portion. Next, a ringed insulating layer is formed on the semiconductor substrate at the top portion of the trench. Afterward, a seed layer on the ringed insulating layer and the semiconductor substrate at the bottom portion of the trench. A photoresist is coated in the trench at the bottom portion. Next, the seed layer is partially removed to expose the ringed insulating layer while the photoresist is used as the shield. The photoresist is then removed to expose the remaining seed layer at the bottom portion. A hemispherical silicon grain layer is deposited from the remaining seed layer on the semiconductor substrate. Ions are doped and driven into the hemispherical silicon grain layer and the semiconductor substrate so as to create a doped area to serve as the lower electrode of the capacitor. Then, a dielectric layer is formed on the lower electrode followed by formation of an upper electrode on the dielectric layer.

In accordance with another aspect of the invention, there is provided a method of fabricating a capacitor of a DRAM cell. The semiconductor substrate can be a p-type silicon substrate. Furthermore, the ringed insulating layer can be a silicon oxide film having a thickness of about 200 angstroms to about 500 angstroms.

In accordance with another aspect of the invention, there is provided a method of fabricating a capacitor of a DRAM cell. The top portion has depth of about 1500 to 2500 angstroms form the upper surface of the semiconductor substrate.

In accordance with a further aspect of the invention, the seed layer is preferably an amorphous silicon layer that has a thickness of about 100 angstroms to 200 angstroms.

In accordance with a further aspect of the invention, there is provided a method of fabricating a capacitor of a DRAM cell. The formation of the ringed insulating layer can further comprise the steps of:

doping oxygen ions into the semiconductor substrate at the top portion of the trench at an angle of about 0 to 30 degrees with respect to a normal line of the upper surface of the semiconductor substrate while rotating the semiconductor substrate to improve doping uniformity throughout the semiconductor substrate at the top portion of the trench; and annealing in argon ambient to form the ringed insulating layer.

Furthermore, in this method, the ion doping step can be carried out by phosphorous ions or arsenic ions at a dosage of about $1\times10^{19}$ atoms/cm$^2$ to about $7\times10^{19}$ atoms/cm$^2$.

In accordance with another aspect of the invention, there is provided a method of fabricating a capacitor of a DRAM cell. The formation of the etching mask further comprises the step of:

growing a pad oxide over the upper surface of the semiconductor substrate;

depositing a pad nitride on the pad oxide;

forming a silicon glass on the pad nitride; and selectively etching the silicon glass, the pad nitride and the pad oxide to form an etching mask with an opening.

In accordance with a further aspect of the invention, the silicon glass is preferably boro-silicate glass (BSG) deposited by an in-situ doped chemical vapor deposition system. The chemical vapor deposition system can be atmospheric pressure chemical vapor deposition (APCVD), sub-atmospheric chemical vapor deposition (SACVD), low pressure chemical vapor deposition (LPCVD), plasma enhanced chemical vapor deposition (PECVD), or high density plasma chemical vapor deposition (HDPCVD.

BRIEF DESCRIPTION OF THE DRAWINGS

The preferred embodiment of the invention is hereinafter described with reference to the accompanying drawings in which.

DETAILED DESCRIPTION OF THE INVENTION

FIGS. 2A to 2H, are cross-sections showing the manufacturing steps of fabricating a capacitor of a DRAM cell in accordance with the embodiment of the invention.

Figure 1A:
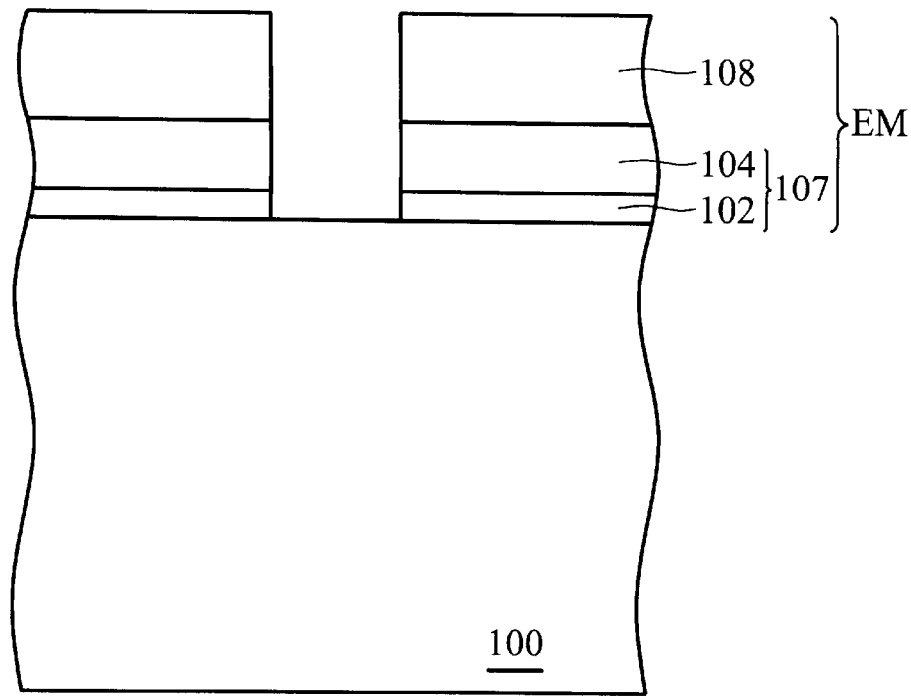
FIGS. 1A to 1H, are cross-sections showing the manufacturing steps of fabricating a capacitor of a DRAM cell in accordance with the prior art.
Figure 1B:
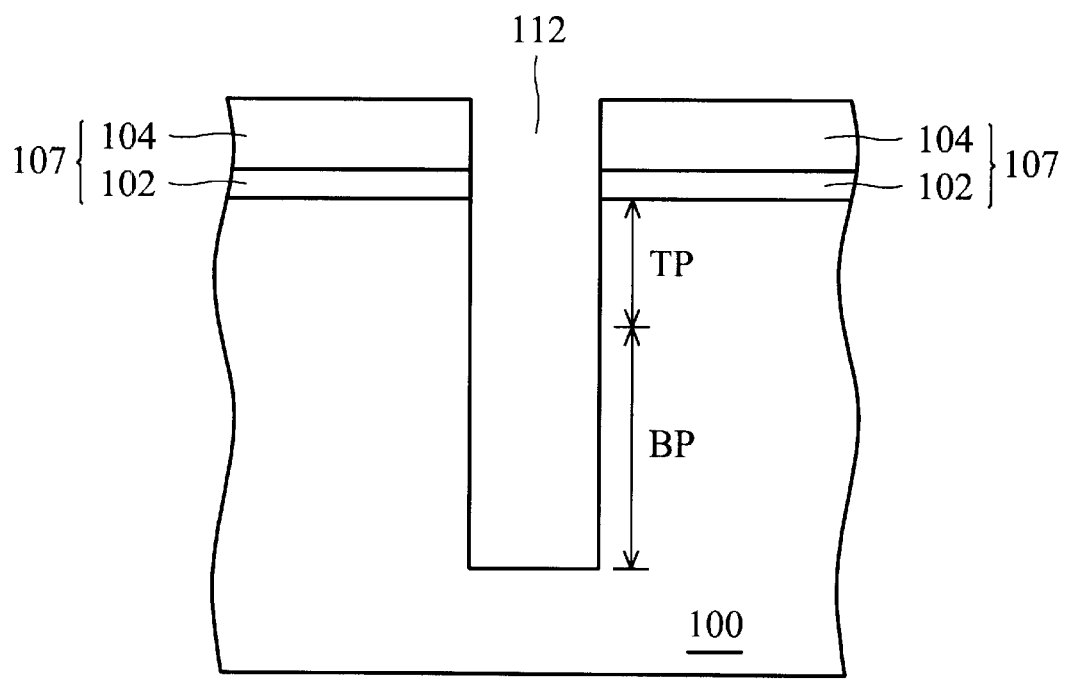
Figure 1C:
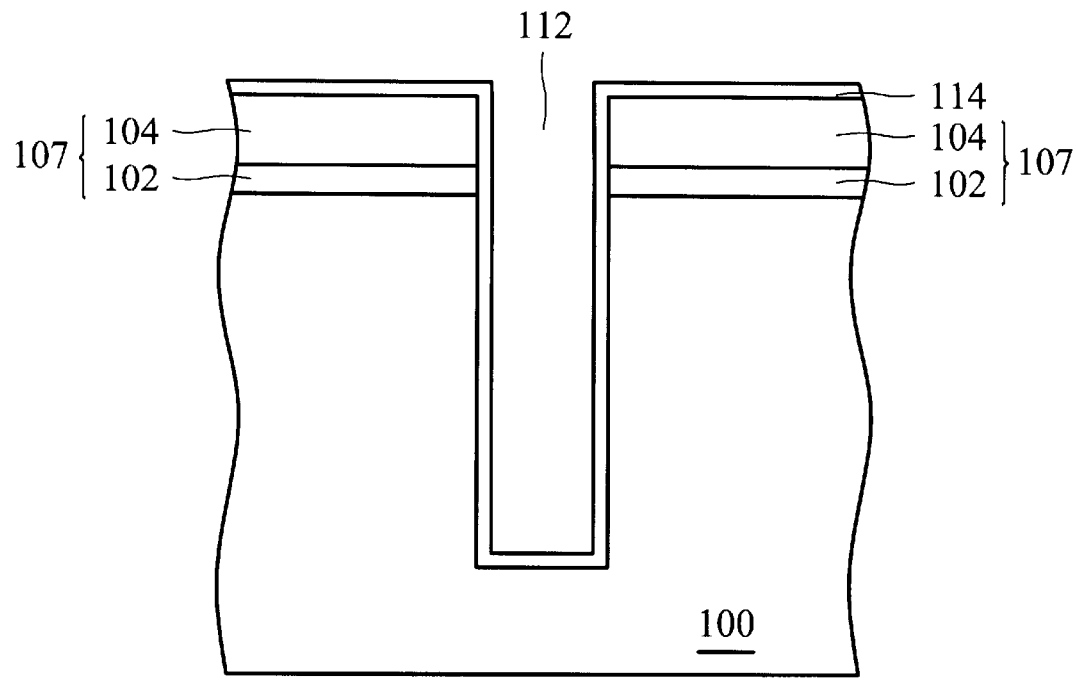
Figure 1D:
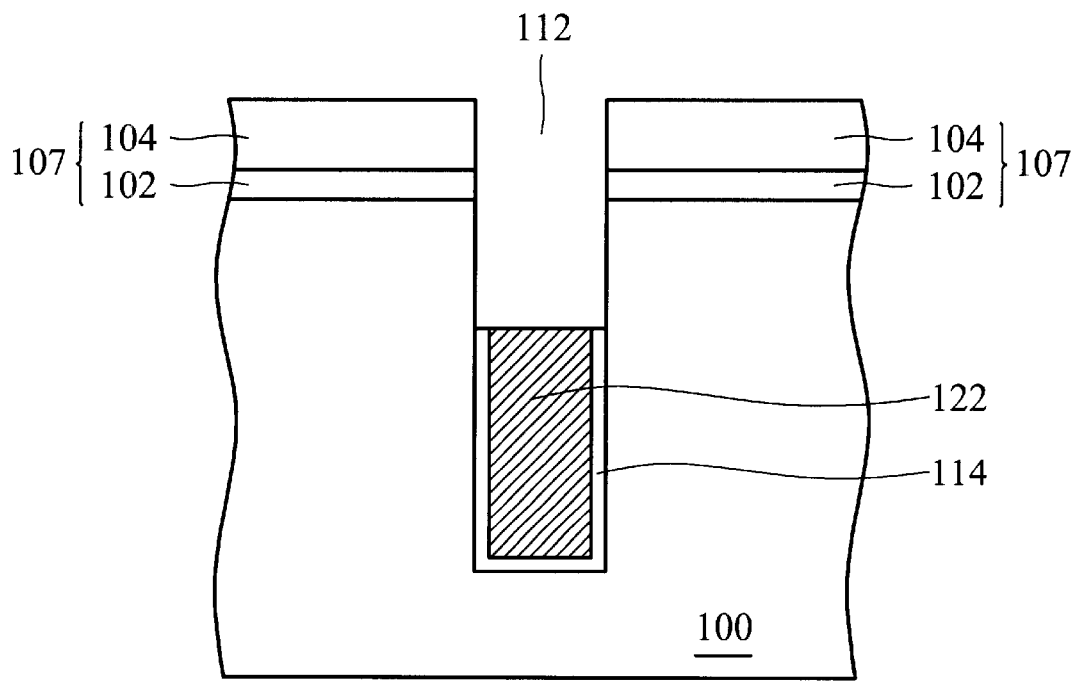
Figure 1E:
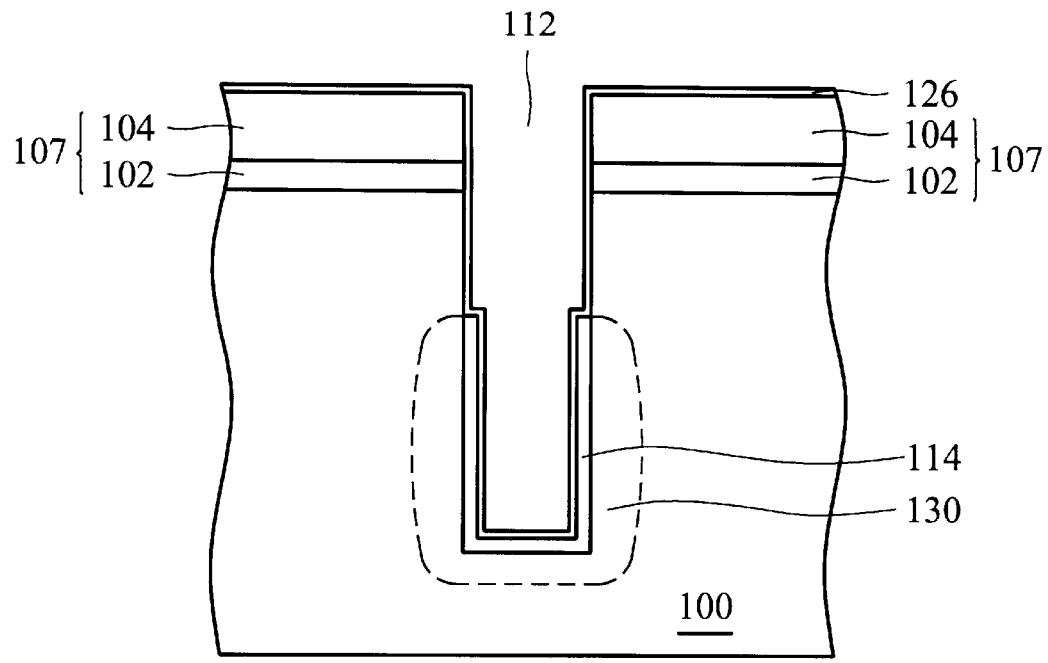
Figure 1F:
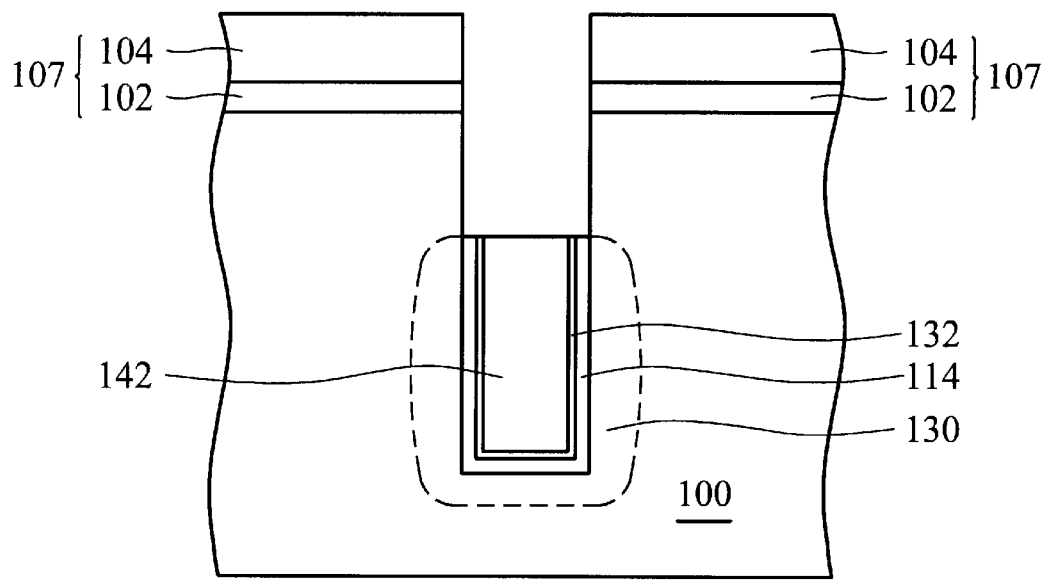
Figure 1G:
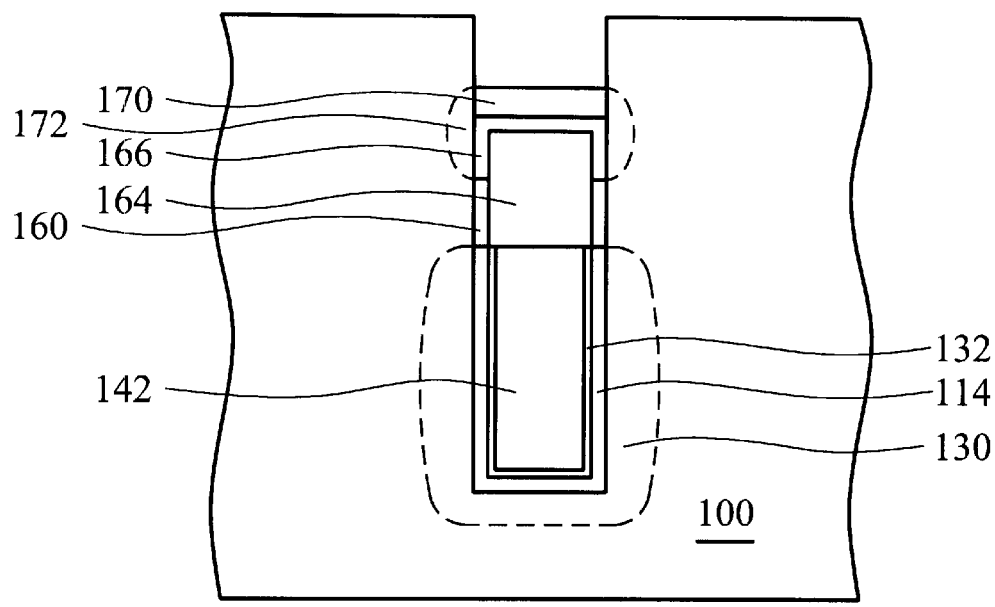
Figure 1H:
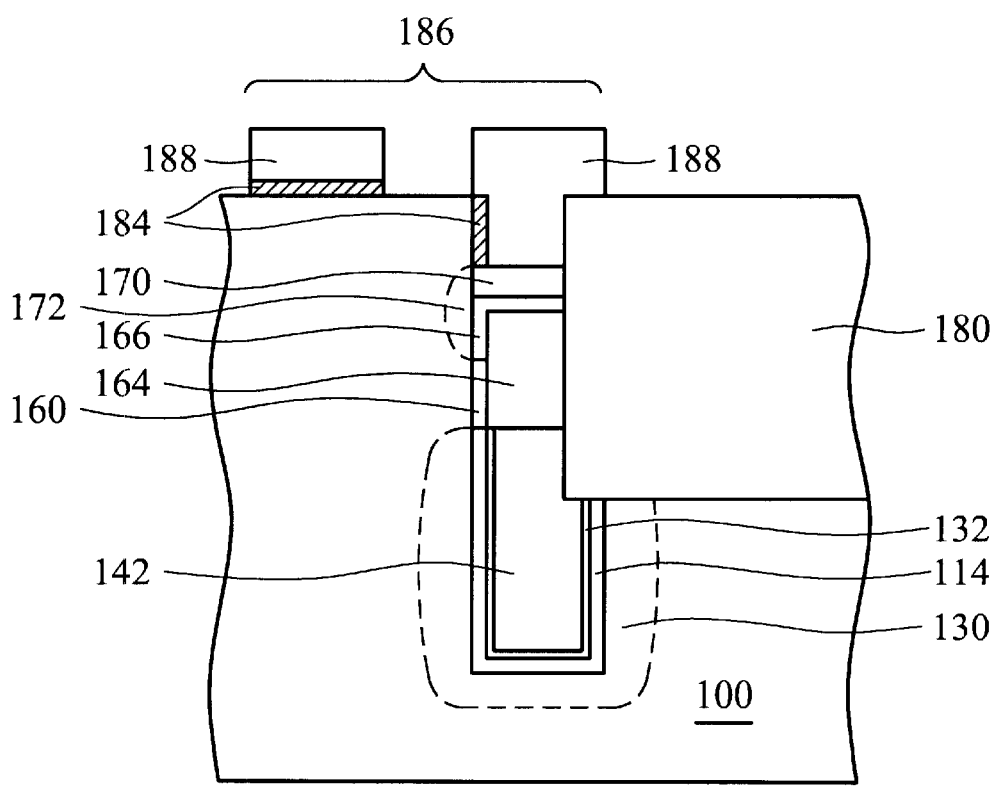
Figure 2A:
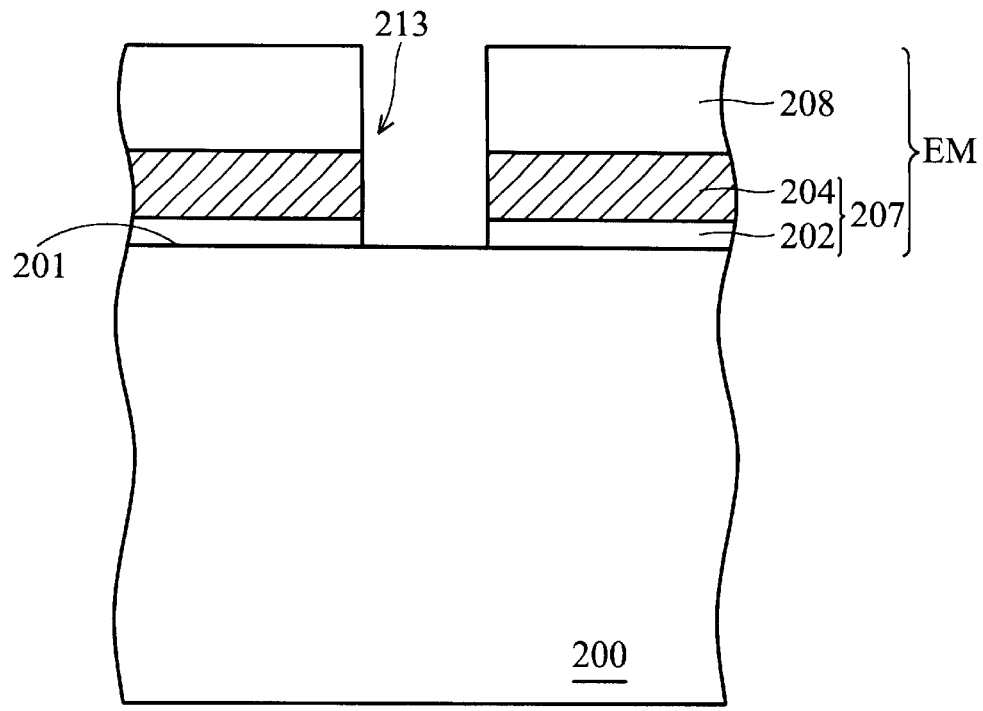
FIGS. 2A to 2H, are cross-sections showing the manufacturing steps of fabricating a capacitor of a DRAM cell in accordance with the embodiment of the invention.

Referring now to FIG. 2A, a semiconductor substrate 200, for example a p-type silicon substrate, is provided. A pad oxide 202, having a thickness of 400 to 600 angstroms, is grown on the upper surface 201 of the semiconductor substrate 200 by thermal oxidation. A pad nitride 204, having a thickness of 1600 to 3000 angstroms, is deposited on the pad oxide 202. Next, a silicon glass 208 such as boro-silicate glass (BSG), having a thickness of 5000 to 20000 angstroms is deposited by an in-situ doped chemical vapor deposition system. The silicon glass 208, pad nitride 204, and pad oxide 202 are defined by conventional photolithography comprising photoresist coating, photoresist exposure, and developing followed by an aniostropic etching so that an etching mask EM having an opening 213 for deep trench is formed on the semiconductor substrate 200. Symbol 207 indicates a hard mask consisting of the pad nitride 204 and the pad oxide 202.

Figure 2B:
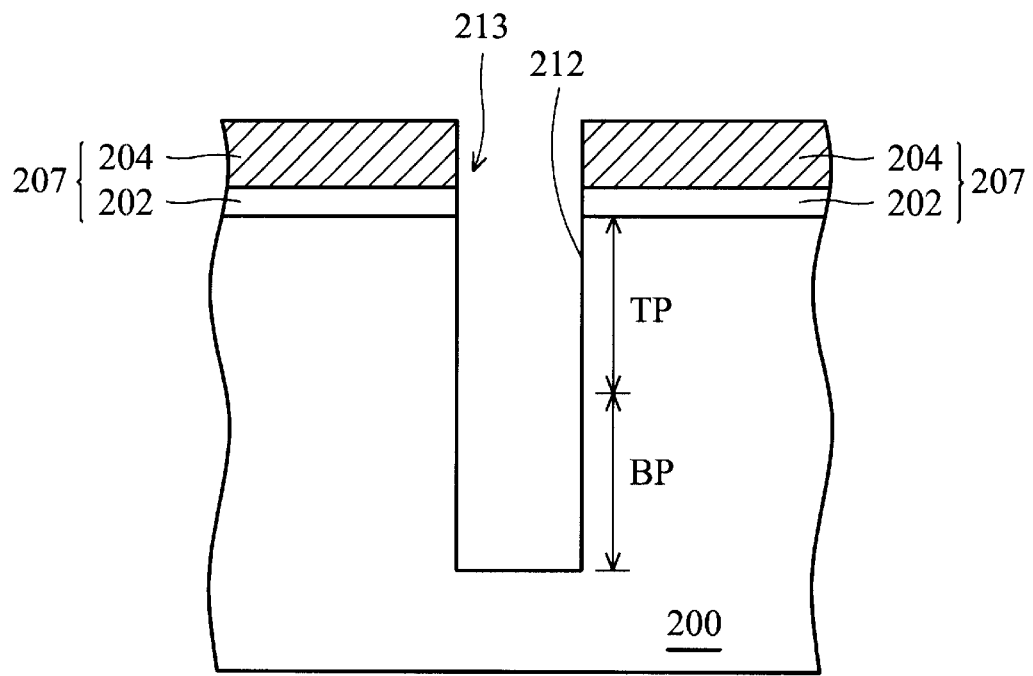

Referring now to FIG. 2B, the semiconductor substrate 200 is anisotropically etched through the opening 213 of the etching mask EM to form a deep trench having a depth of 60000 to 70000 angstroms. Then, the silicon glass 208 is removed to expose the pad nitride 204 by an isotropic etching step. The deep trench 212 has a top portion TP, having a depth of 1500 angstroms to 2500 angstroms form the upper surface 201 of the semiconductor substrate 200, and a bottom portion BP.

Figure 2C:
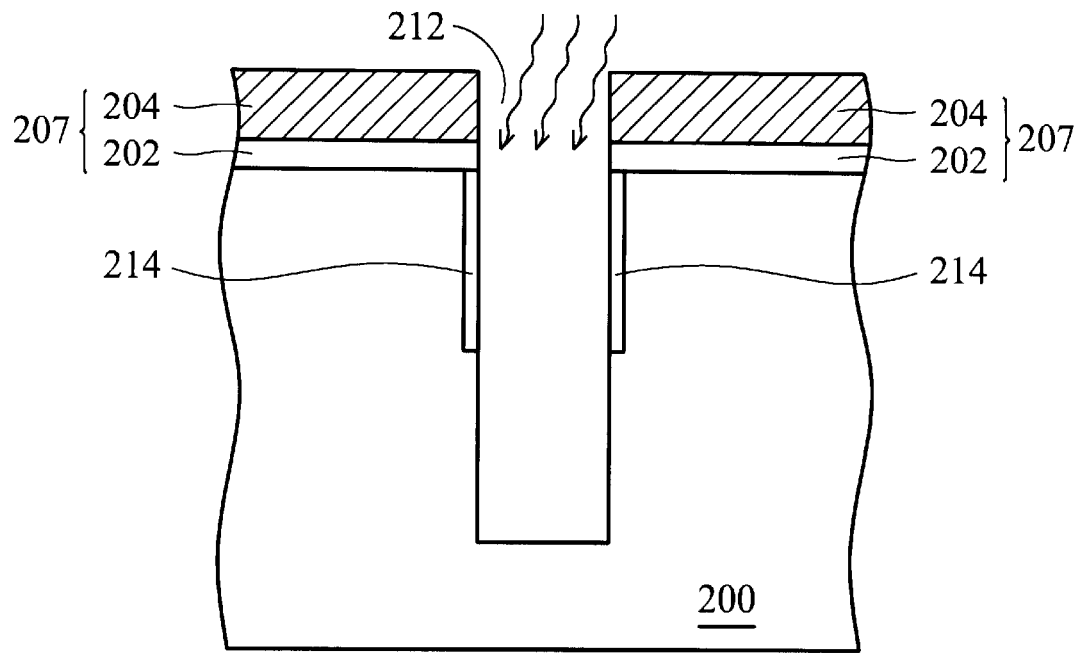
Figure 2D:
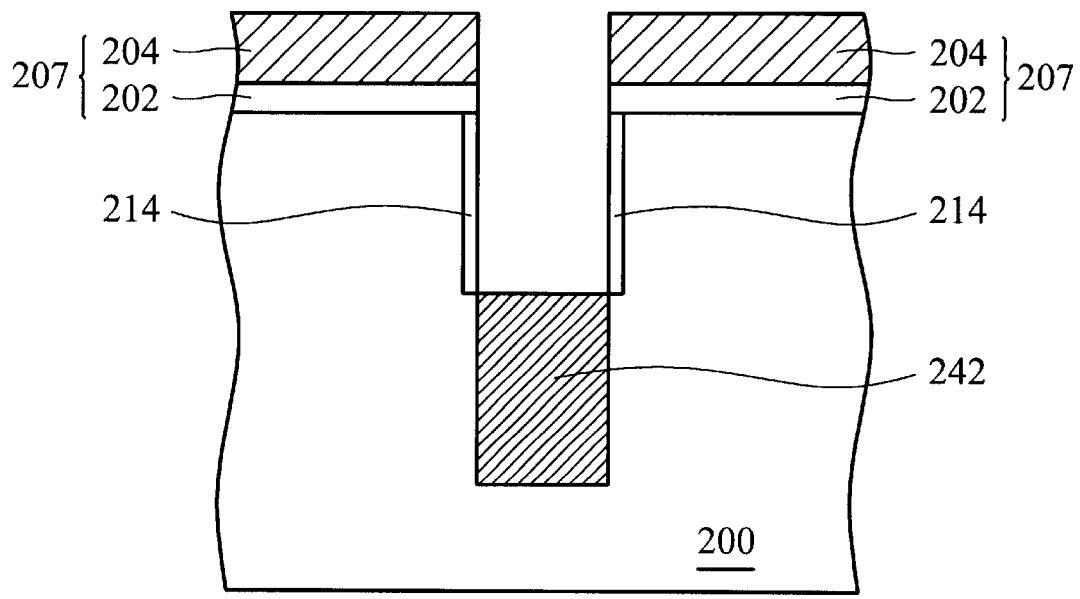

As shown in FIG. 2C, a ringed insulating layer 214, having a thickness of 200 to 500 angstroms, is grown on the semiconductor substrate 200 at the top portion TP of the deep trench 212. That is to say, oxygen ions are doped into the semiconductor substrate 200 at the top portion TP of the deep trench 212 at an angle of about 0 to 30 degrees with respect to a normal line of the upper surface 201 of the semiconductor substrate 200. In order to improve oxygen-doping uniformity throughout the semiconductor substrate 200 at the top portion TP, the semiconductor substrate 200 is preferably rotated while doping the oxygen ions. Next, an annealing step is performed in argon ambient to form the ringed insulating layer 214.

An amorphous silicon seed layer (not shown) having a thickness of 100 to 200 angstroms is deposited on the hard mask 207 and extended on the sidewall and the bottom of the deep trench 212 by low pressure chemical vapor deposition (LPCVD). A photoresist layer is spin coated on the semiconductor substrate 200 and filled in the deep trench 212. The photoresist layer is then partially removed to leave a photoresist 242 formed in the bottom portion BP of the deep trench 212 to expose a part of the seed layer. Next, the exposed seed layer is removed to expose the ringed insulating layer 214 and the pad nitride 204.

Figure 2E:
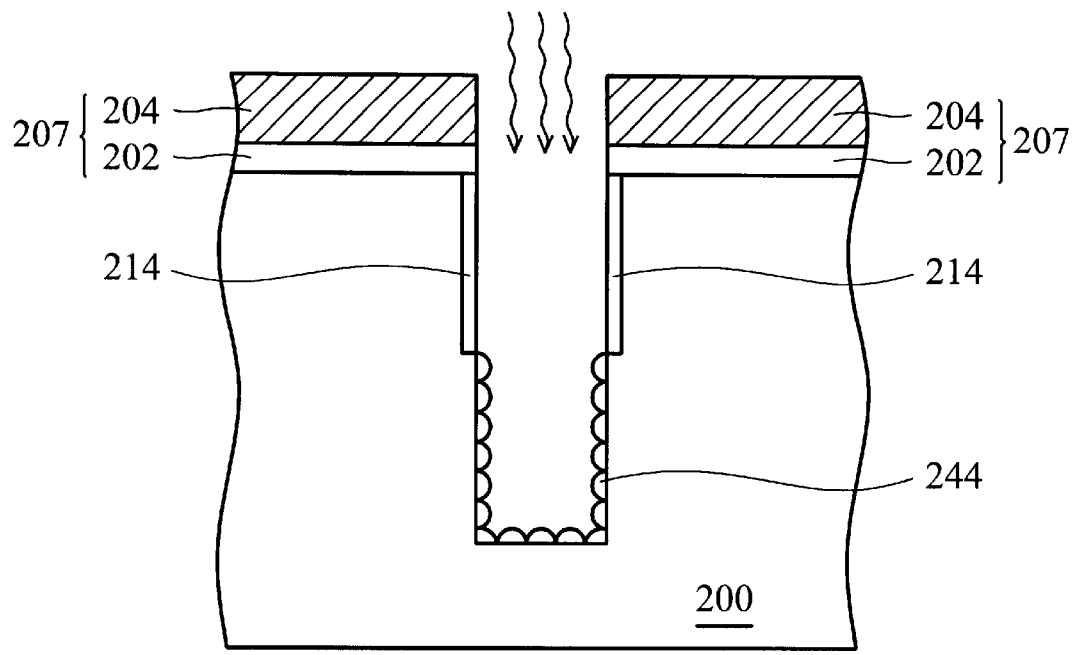

Referring to FIG. 2E, the residual photoresist 242 is removed. Afterward, the seed layer is preferably doped by introducing phosphorus or phosphine having a concentration of 0.5 to 1% by volume for 5 to 20 seconds. The flow rate of phosphine is about 5 to 15 standard cc per minute (sccm) thus improving the size uniformity of the hemispherical silicon grain (HSG) formed in the subsequent step.

A LPCVD system introducing silane is used to deposit a hemispherical silicon grain (HSG) layer 244 from the residual seed layer at a temperature of 500 to 650° C. for 5 to 20 minutes. The deposition chamber is kept at $1\times10^{-11}$ to $1\times10^{-7}$ torr.

Figure 2F:
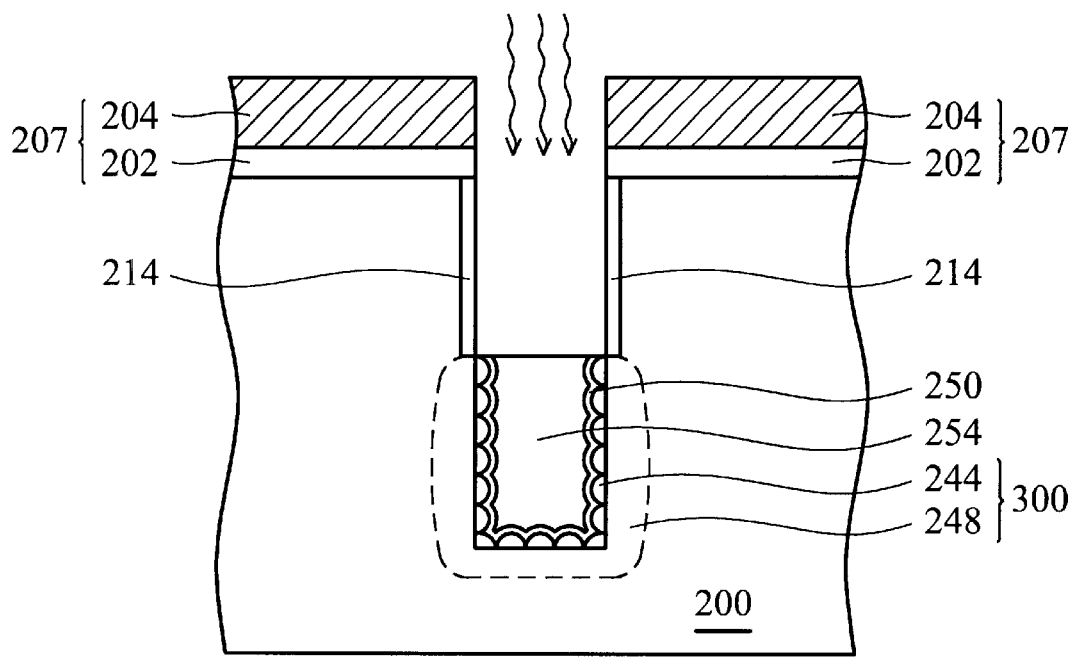

Referring now to FIG. 2F, the hemispherical silicon grain (HSG) layer 244 is doped by phosphorous ions or arsenic ions at a dosage of about $1\times10^{19}$ atoms/cm$^2$ to about $7\times10^{19}$ atoms/cm$^2$. Then, the ions are driven into the semiconductor substrate 200 so as to create a doped area 248, having a junction depth of 800 to 1200 angstroms, to serve as the lower electrode 300 of the capacitor. A dielectric layer 250, for example silicon oxide/silicon nitride/silicon oxide (ONO) or a deposited tantalum oxide, is formed on the lower electrode 300. Next, an upper electrode 254 is formed on the dielectric layer 250 at the bottom portion BP of the deep trench 212. The upper electrode 254, consisting of doped polysilicon, can be deposited by in-situ doped LPCVD followed by etching back to leave a doped polysilicon formed at the bottom portion BP on the dielectric layer 250.

Figure 2G:
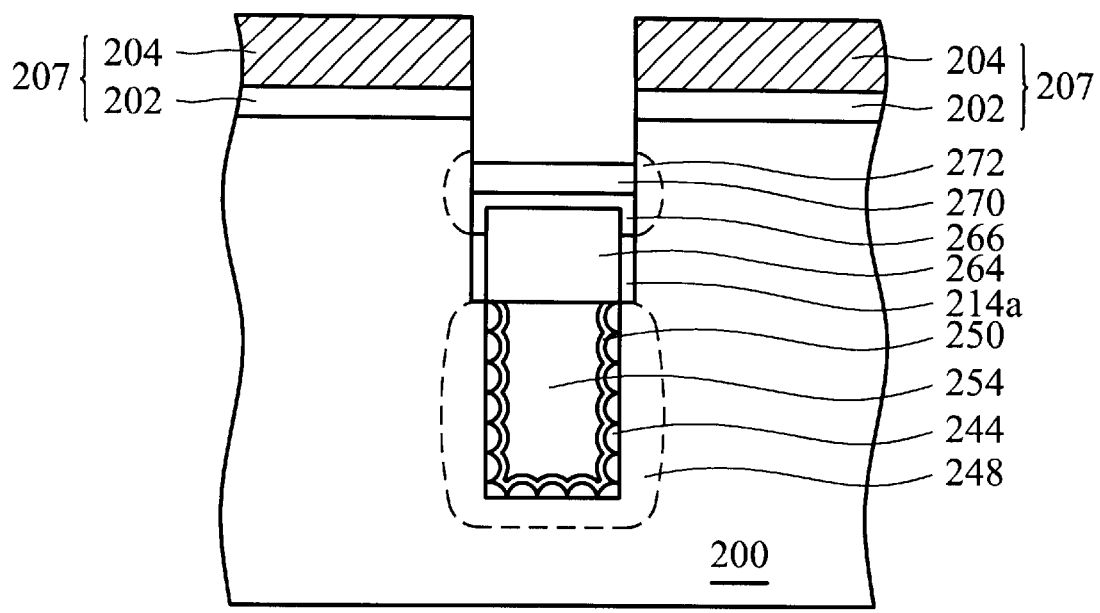

Next, as shown in FIG. 2G, a doped polysilicon layer is deposited on the semiconductor substrate 200 to fill the deep trench 212 by in-situ doped LPCVD. The doped polysilicon layer is partially removed by chemical mechanical polishing (CMP) followed by etching back to leave a conductive structure 264 having a depth of 1300 to 2000 angstroms. Then, the ringed insulating layer 214 is partially removed by etching back to leave a ringed insulating layer 214a whose upper surface is lower than that of the conductive structure 264. Afterward, a conductive film 266, having a thickness of 650 to 850 angstroms, is covered on the conductive structure 264 and the remaining ringed insulating layer 214a. The conductive film 266 is a polysilicon film doped with phosphorus or arsenic ions. The insulating layer 270, having a thickness of 500 to 1000 angstroms, is formed on the conductive film 266. The phosphorus or arsenic ions in the conductive film 266 are diffused and driven in the semiconductor substrate 200 to create a doped area to serve as the source region 272.

Figure 2H:
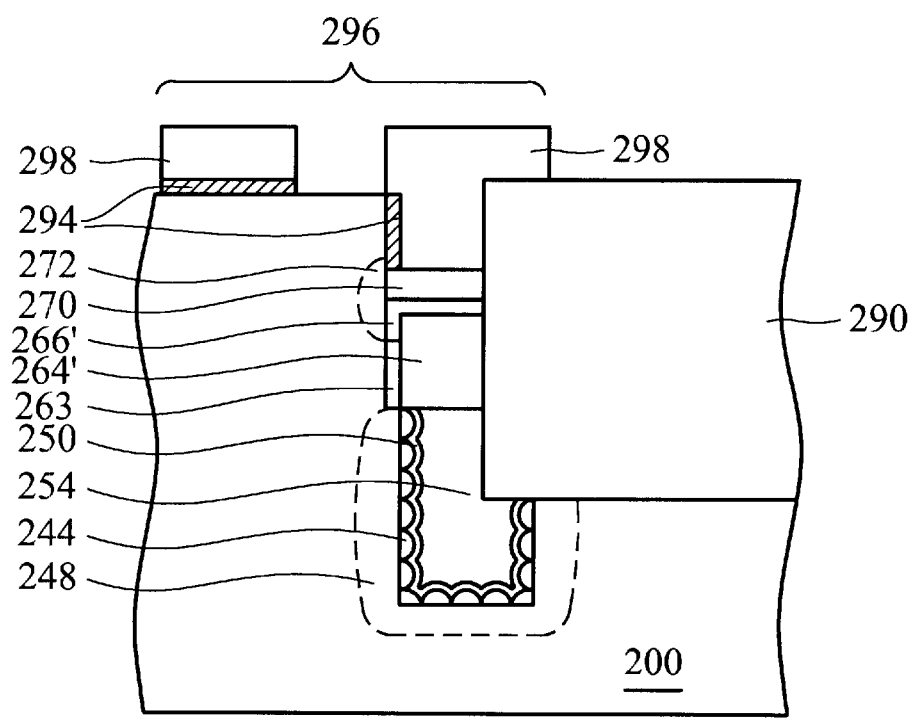

Then, referring to FIG. 2H, the hard mask 207 is removed. Sallow trench isolation 290 for defining an active region 296, gate oxides 294, and word lines 298 are then formed by conventional skills.

According to the embodiment of the invention, the lower electrode, hemispherical silicon grain layer, of the capacitor has rugged surface thus increasing the capacitance.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A method of fabricating a capacitor of a DRAM cell, comprising the steps of:

providing a semiconductor substrate;

forming an etching mask with an opening on the semiconductor substrate;

etching the semiconductor substrate through the opening of the etching mask to form a trench having a top portion and a bottom portion;

forming a ringed insulating layer on the semiconductor substrate at the top portion of the trench;

forming a seed layer on the ringed insulating layer and the semiconductor substrate at the bottom portion of the trench;

coating a photoresist in the trench at the bottom portion;

partially removing the seed layer to expose the ringed insulating layer while the photoresist is used as the shield;

removing the photoresist to expose the remaining seed layer at the bottom portion;

depositing a hemispherical silicon grain layer from the remaining seed layer on the semiconductor substrate;

doping ions and driving in the ions to the hemispherical silicon grain layer and the semiconductor substrate so as to create a doped area to serve as the lower electrode of the capacitor;

forming a dielectric layer on the lower electrode; and forming an upper electrode on the dielectric layer.

2. A method of fabricating a capacitor of a DRAM cell as claimed in claim 1, wherein the semiconductor substrate is a p-type silicon substrate.

3. A method of fabricating a capacitor of a DRAM cell as claimed in claim 1, wherein the ringed insulating layer is a silicon oxide film.

4. A method of fabricating a capacitor of a DRAM cell as claimed in claim 1, wherein the ringed insulating layer has a thickness of about 200 angstroms to about 500 angstroms.

5. A method of fabricating a capacitor of a DRAM cell as claimed in claim 1, wherein the top portion has a depth of about 1500 angstroms to about 2500 angstroms from the upper surface of the semiconductor substrate.

6. A method of fabricating a capacitor of a DRAM cell as claimed in claim 1, wherein the formation of the ringed insulating layer further comprises the steps of:

doping oxygen ions into the semiconductor substrate at the top portion of the trench at an angle of about 0 to 30 degrees with respect to a normal line of the upper surface of the semiconductor substrate while rotating the semiconductor substrate to improve doping uniformity throughout the semiconductor substrate at the top portion of the trench; and annealing in argon ambient to form the ringed insulating layer.

7. A method of fabricating a capacitor of a DRAM cell as claimed in claim 1, wherein the seed layer is an amorphous silicon layer.

8. A method of fabricating a capacitor of a DRAM cell as claimed in claim 1, wherein the seed layer has a thickness of about 100 angstroms to 200 angstroms.

9. A method of fabricating a capacitor of a DRAM cell as claimed in claim 1, wherein the ion doping step is carried out by phosphorous ions or arsenic ions at a dosage of about $1\times10^{19}$ atoms/cm$^2$ to about $7\times10^{19}$ atoms/cm$^2$.

10. A method of fabricating a capacitor of a DRAM cell as claimed in claim 1, wherein the formation of the etching mask further comprises the step of:

growing a pad oxide over the upper surface of the semiconductor substrate;

depositing a pad nitride on the pad oxide;

forming a silicon glass on the pad nitride; and selectively etching the silicon glass, the pad nitride and the pad oxide to form the etching mask with an opening.

11. A method of fabricating a capacitor of a DRAM cell as claimed in claim 10, wherein the silicon glass is borosilicate glass (BSG) deposited by atmospheric pressure chemical vapor deposition (APCVD), sub-atmospheric chemical vapor deposition (SACVD), low pressure chemical vapor deposition (LPCVD), plasma enhanced chemical vapor deposition (PECVD), or high density plasma chemical vapor deposition (HDPCVD).

12. A method of fabricating a capacitor of a DRAM cell as claimed in claim 1, wherein the formation of the photoresist further comprises the steps of:

spin coating a photoresist layer on the semiconductor substrate to fill the trench; and partially etching the photoresist layer to leave the photoresist at the bottom portion of the trench.

* * * * *